United States Patent [19]
Atkinson

[11] Patent Number: 5,471,661
[45] Date of Patent: Nov. 28, 1995

[54] ULTRA HIGH SPEED SCAN SYSTEM

[76] Inventor: Noel D. Atkinson, 4710 Ingleside La., Indianapolis, Ind. 46227

[21] Appl. No.: 972,855

[22] Filed: Nov. 6, 1992

Related U.S. Application Data

[63] Continuation of Ser. No. 583,040, Sep. 14, 1990, Pat. No. 5,212,817.

[51] Int. Cl.$^6$ ....................................................... H04B 1/26
[52] U.S. Cl. .................................... 455/165.1; 455/161.2; 455/260
[58] Field of Search ........................... 455/165.1, 173.1, 455/182.2, 186.1, 192.2, 260, 60, 307, 161.2, 164.2, 222, 245; 331/14

[56] References Cited

U.S. PATENT DOCUMENTS

| | | | |
|---|---|---|---|
| 4,105,948 | 8/1978 | Wolkstein | 331/14 |
| 4,130,806 | 12/1978 | Van Gerwen et al. | 455/307 |
| 4,361,906 | 11/1982 | Sakamoto | 455/165.1 |
| 4,737,728 | 4/1988 | Nakamura et al. | 455/60 |
| 4,891,824 | 1/1990 | Takamura et al. | 455/174.1 X |
| 5,073,869 | 12/1991 | Bjerede | 364/718 |
| 5,170,492 | 12/1992 | Moller et al. | 455/260 |

*Primary Examiner*—Edward F. Urban
*Attorney, Agent, or Firm*—Roger M. Rickert

[57] ABSTRACT

A high speed scanning radio has conventional RF amplifier, a mixer, a frequency synthesizer for the generation of local oscillator signals, an IF amplifier, a demodulator, and an audio output stage. The receiver includes a memory for storing a plurality of frequency codes corresponding to respective radio channels and a scan control for reading those codes, two for each channel, into the frequency synthesizer. A linear combination of each pair of distinct frequency codes is utilized to generate a local oscillator signal. A squelch circuit including a multi-order analog highpass filter, noise diode detector, a multiplexer, an analog to digital converter, and an arrangement for storage of successive average values of noise, and for comparing those successive noise values with one another to provide a noise difference and for comparing successive noise differences with a predetermined squelch control value, detection of the presence of a signal on a channel being indicated when successive noise differences exceed the predetermined squelch control value. The squelch circuit disables the audio output stage in the absence of a detected signal on any one of the channels corresponding to said sequentially read pair of frequency codes, and the squelch circuit is deactivated and the scan control interrupted upon detection of the presence of a signal on a channel.

2 Claims, 11 Drawing Sheets

ULTRA HIGH SPEED SCAN SYSTEM

This is a divisional application of application Ser. No. 583,040 now U.S. Pat. No. 5,212,817 filed Sep. 14, 1990.

SUMMARY OF THE INVENTION

The present invention relates generally to scanning radio receivers and more particularly to scanning radio receivers with frequency synthesizers. Modern scanning receivers generate local oscillator frequencies with a frequency synthesizer controlled by frequency codes stored in memory. Typically, the memory contains a fairly large number of frequency codes, but it can be reprogrammed for operation on different frequencies. The channel capacity of scanning receivers has heretofore been limited not only because of the size, cost and complexity of memory circuitry and associated addressing circuitry; but also because of technical limitations on scanning speed. A finite amount of time is required to lock on to each frequency in the active scanning sequence, and then to detect activity on the current channel in order to determine whether or not to continue scanning.

The present state of the scanning radio receiver art is well illustrated by U.S. Pat. Nos. 4,888,815 and 4,947,456. In each of these patented arrangements, a frequency synthesizer is loaded with a digital code read from memory which performs band switching and supplies tracking signals and a local oscillator signal to a multi-band RF amplifier and mixer circuitry. The 4,888,815 patent discloses a multi-band scanning radio receiver which is operable in a plurality of different geographical regions without reprogramming. Digital codes for public-service-band frequency allocation for each of a plurality of geographics regions are stored in a memory which is sequentially accessed to read the digital codes for the frequency allocations for a selected geographical region. In the U.S. Pat. No. 4,947,456, disabling of the audio output (squelch),in the absence of detected signals is achieved by converting multiple samples of an incoming signal to digital values and generating a mute signal when the average value of at least ten of the converted samples is below a predetermined squelch level. An output line from the FM detector is grounded in response to the mute signal. In the U.S. Pat. No. 4,947,456, sequentially read frequency codes are loaded into a frequency synthesizer as is a code corresponding to a frequency a fixed (station spacing) frequency increment away from the last frequency code loaded into the frequency synthesizer.

A limitation of conventional and new higher and higher speed scanning radio receivers is the fact that a low reference frequency of 2.5 Khz, 4.1666 Khz, 5 Khz and 12.5 Khz are used in the frequency synthesizer. The lower reference frequency limits the lockin and settling time of the frequency synthesizer to approximately 18 milliseconds. This will leave a maximum of 7 milliseconds, at 40 channels per second, for the CPU to detect whether a signal is present and to stop or continue scanning.

Among the several objects of the present invention may be noted the provision of an increase in scanning speed of a scanning radio; the provision of a scanning radio which utilizes a linear combination of pairs of distinct frequency codes to generate a local oscillator signal; the provision of a scanning radio which stores successive average values of noise, compares those successive noise values with one another to provide a noise difference and then compares successive noise differences with a predetermined squelch control value and detects the presence of a signal on a channel when successive noise differences exceed a predetermined squelch control value; the provision of a scanning radio in accordance with the previous object which effects the comparison by performing a fast fourier transform on the noise signal; and the provision of a scanning radio with enhanced ability to discriminate between true radio signals and spurious signals.

These as well as other objects and advantageous features of the present invention will be in part apparent and in part pointed out hereinafter.

In general, a high speed scanning radio receiver has an RF amplifier, a mixer, a frequency synthesizer for generating a local oscillator signal, an IF amplifier, a demodulator and an audio output stage. A memory is provided for storing a plurality of frequency codes corresponding to respective radio channels. Distinct pairs of frequency codes for each channel to be scanned are sequentially read from the memory and loaded into the frequency synthesizer. A linear combination of each pair of distinct frequency codes is utilized to generate a local oscillator signal the frequency of which is the product of the linear combination of distinct frequency codes and a reference frequency, and each scanned channel is sensed to detect the presence of a signal on the channel. A squelch circuit is included for disabling the audio output stage in the absence of a detected signal on any one of the channels corresponding to the sequentially read pair of frequency codes and the squelch circuit is deactivated and the scan control means interrupted upon detection of the presence of a signal on a channel.

Also in general and in one form of the invention, a high speed scanning radio receiver has an RF amplifier, a mixer, a frequency synthesizer for generating a local oscillator signal, an IF amplifier, modulated signal filters, a demodulator, demodulated signal filters, and an audio output stage. All of the demodulated signal filters are digital filters with each digital filter having an analog to digital converter preceeding and a digital to analog converter subsequent in the signal processing path.

Still further in general, a method of operating a phase locked loop frequency synthesizer to sequentially generate a plurality of different frequency signals includes, for each such frequency, a first coarse tuning of the loop to achieve phase coincidence at a first frequency near the desired final frequency and a second fine tuning of the loop to adjust the frequency from the first frequency to the desired final frequency. The loop is opened between the coarse tuning and fine tuning to prevent undesirable disturbances in the operation of the loop. The loop is reclosed to complete the fine tuning at a time when the loop is near phase coincidence.

BRIEF DESCRIPTION OF THE DRAWING

Corresponding reference characters indicate corresponding parts throughout the several views of the drawing.

The exemplifications set out herein illustrate a preferred embodiment of the invention in one form thereof and such exemplifications are not to be construed as limiting the scope of the disclosure or the scope of the invention in any manner.

DESCRIPTION OF THE PREFERRED EMBODIMENT

Figure 1:
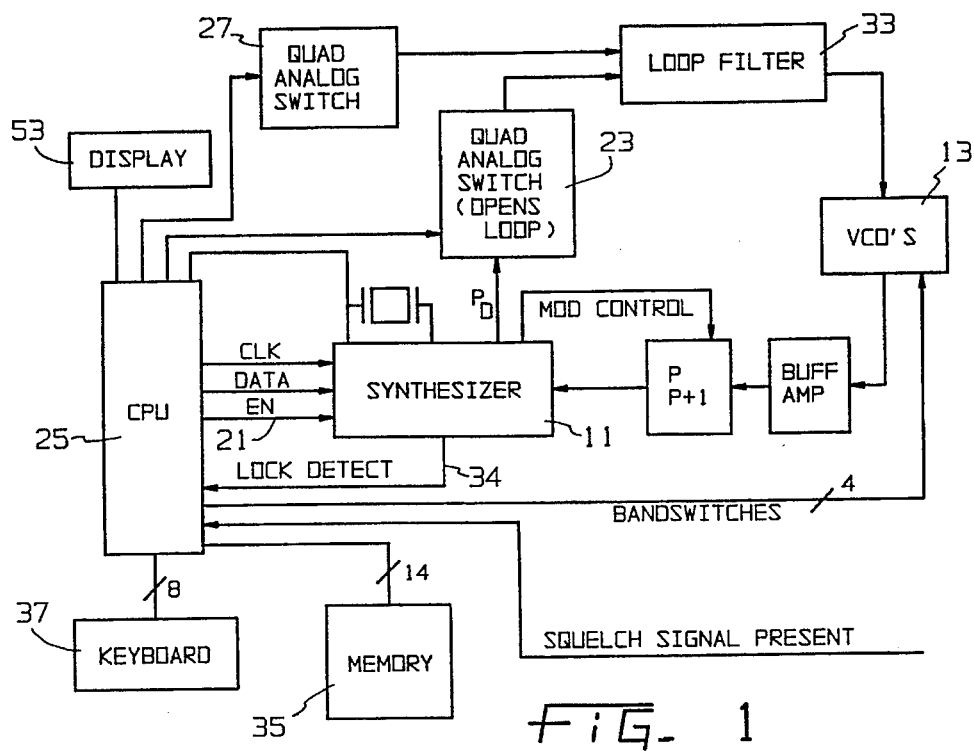
FIG. 1 is a schematic block diagram illustrating a frequency synthesizer with reference incrementing.
Figure 4:
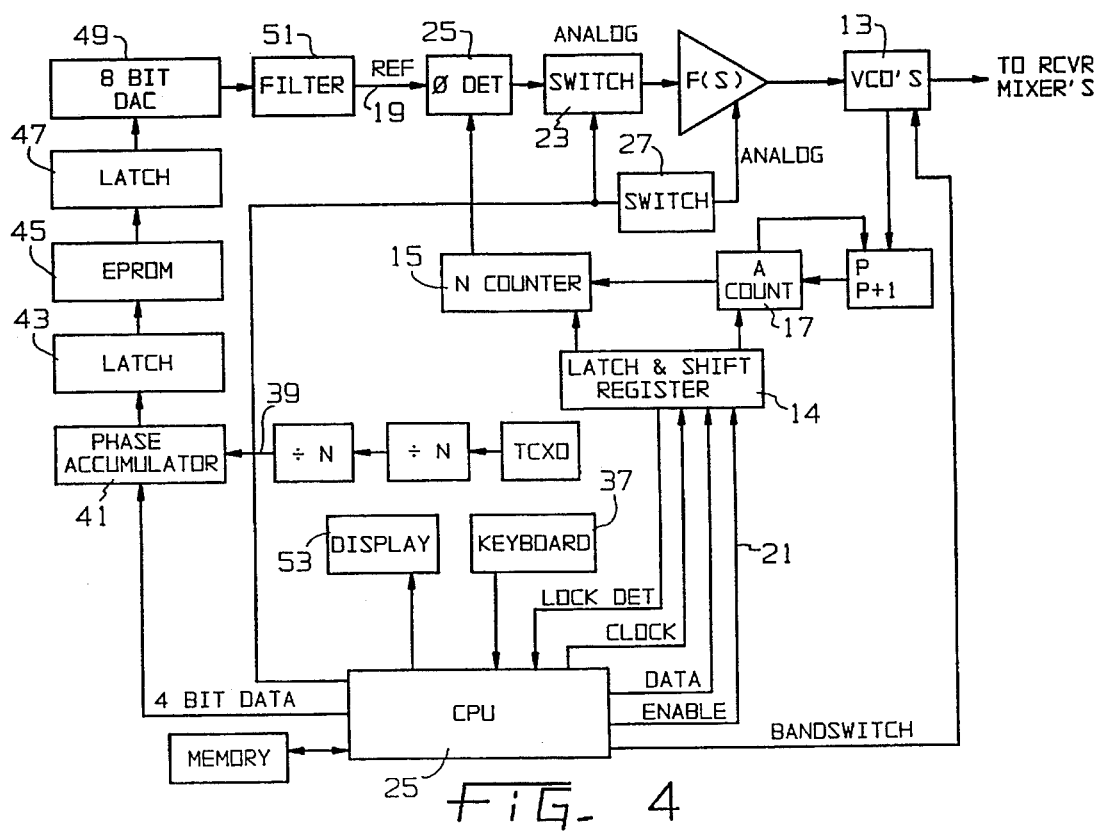
FIG. 4 is a schematic block diagram of circuitry for the direct digital synthesis of the reference frequency in the frequency synthesizer of FIG. 1.
Figure 2:
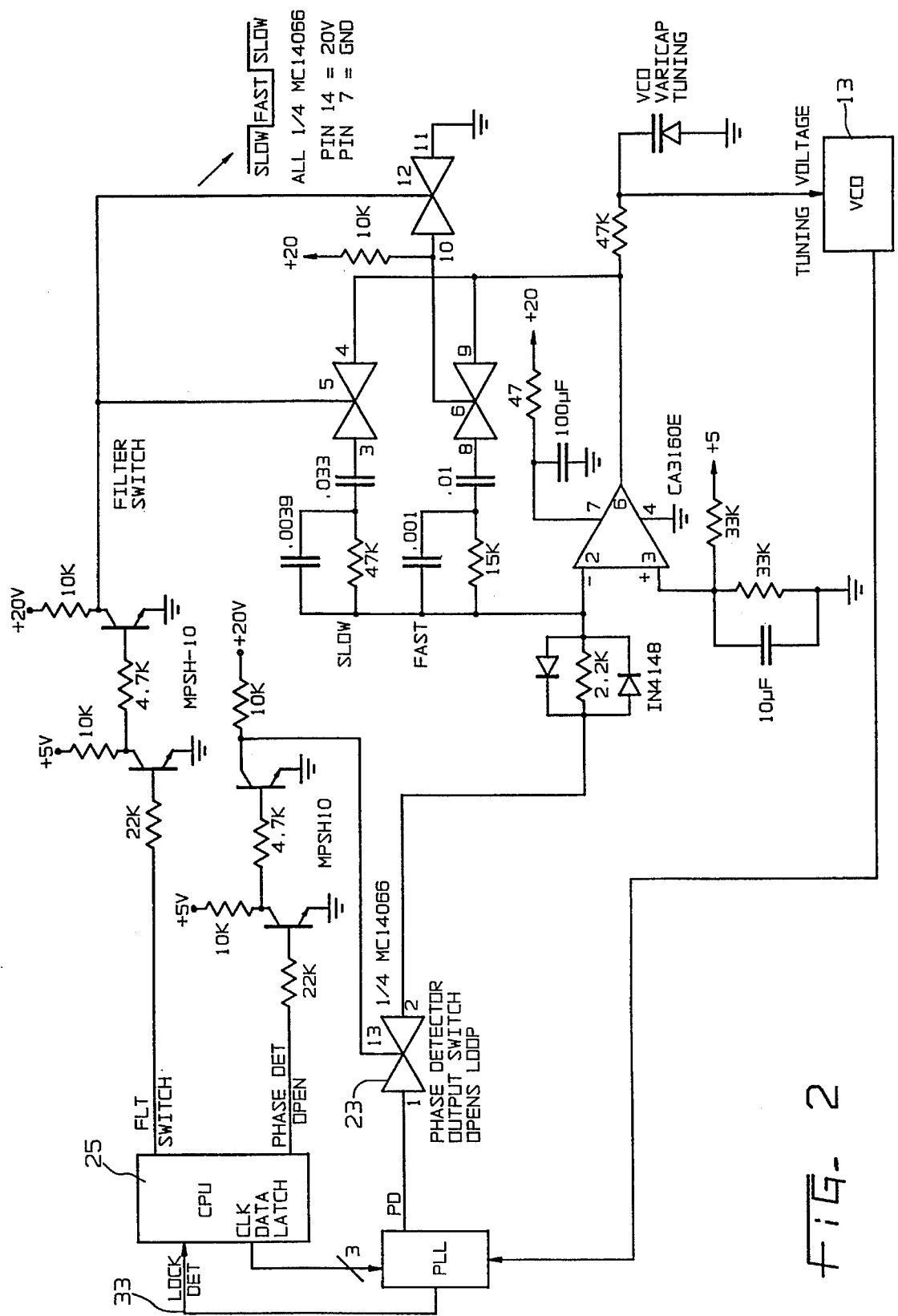
FIG. 2 is a schematic block diagram illustrating the details of the loop filter of the frequency synthesizer with reference incrementing of FIG. 1.

The present invention uses a reference incrementing technique illustrated primarily in FIGS. 1, 2 and 4 to significantly speed up the lockin process. When a channel code is loaded into the synthesizer 11, which is comprised of N and A counters (15 and 17 respectively in FIG. 4), the frequency of the voltage controlled oscillator (VCO) 13 is obtained from the following relationship:

Fvco=(PN+A)Fref

Where P=Prescaler dual modulus value

N=Number loaded into N counter

A=Number loaded into A counter with a limitation that N>A.

R=Reference code up to 14 bits

Fref=Reference divided by (1 to 32,768)

The purpose of the invention is to increase the initial lockin speed by a factor of 10 or greater. This can be accomplished by first loading into the N counter 15 a value of N that is 1/10 as large as normally required. Simultaneously the reference (e.g., line 19 in FIG. 4) can be increased by a corresponding factor of 10 or greater in conjunction with the reduction in N counter value. A strobed latch enable on line 21 immediately following the first data load will enter the values into the reference counter section of shift register 14 and N counter 15. The A counter 17 will be set to 0, if N is not greater than maximum A to calculate a total N that is as close as possible to the final value which allows for the shortest possible lock time. It should be noted that this frequency may or may not be exactly the desired frequency but is in close proximity to it. The loop filter and switching arrangement are shown in FIG. 2. An analogue switch, e.g., a (Motorola) MC14068 is used to switch the loop filter 33 values for fast and slow (Low reference frequency) operation. In conjunction with the filter, another switch 23 is utilized to open the loop at the output of the phase detector. The filter switching is controlled by a central processing unit (CPU) 25 and uses the fourth section 27 of the MC14066 for the inverting and toggle between the filter switched values. The filter value time constants are 10 times faster for the fast lock and switch back to a value that is 10 times slower at final lock. The synthesizer 11 may be implemented using a Motorola MC 145157P, 145158P or 145159P, or a Fujitsu MB 1504 with internal prescaler.

Figure 3:
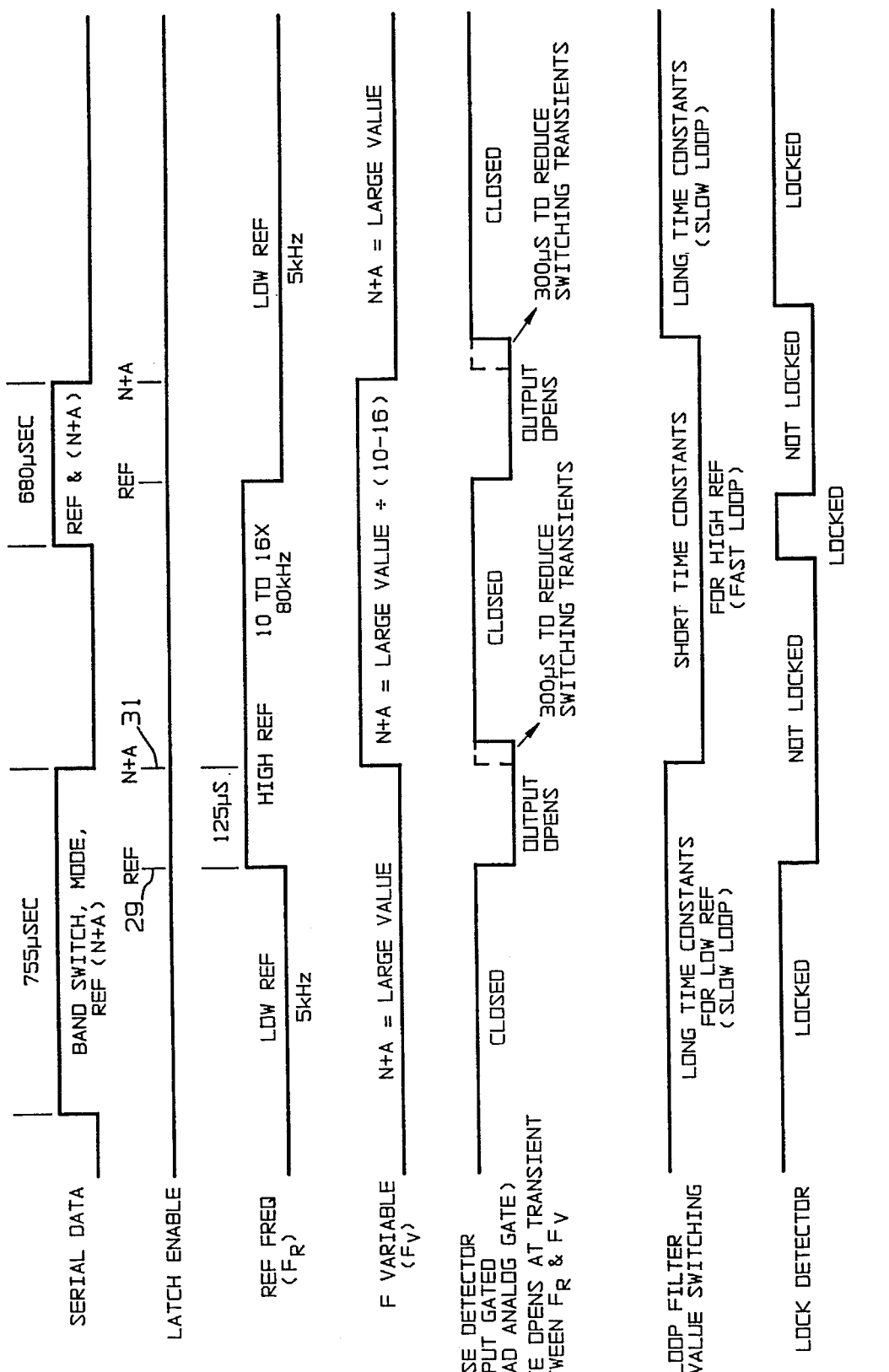
FIG. 3 is a timing diagram of the reference incrementing system of FIGS. 1 and 2.

The phase locked loop (PLL) serial data and latch enable are shown in the timing diagram of FIG. 3. The first terms in the serial data are the bandswitching information, receive mode (Am,Nfm,Wfm) and the reference frequency code usually (10–16 times higher) and the N and A values with A set to 0 if the value of N is lower than the maximum A value. The latch enable has 2 outputs, one shown at 29 to latch the reference and the second at 31 to load the N and A values. If the PLL has been previously locked to a low reference with a steady state DC voltage value associated with the loop filter 33, then the new reference and N and A values loaded into the PLL phase detector will initially create a very large phase transient as the difference between the reference and the VCO/N frequencies occur. In order to reduce the transient, the phase locked loop is opened by the MC14066 analogue switch 23 at the first latch enable and remains open for 300 microseconds after the last latch enable. During this time period, the lock detector output 34 is sampled at a 100 microsecond or faster rate looking for the lock detector to be at its first zero condition indicating phase coincidence. At the moment of phase coincidence, the loop is closed by turning on the MC14066 switch 23. The loop values are switched for fast lockup. The fast lockup occurs within 1 millisecond which is not the exact frequency desired but in close proximity to it. Then the process is repeated by switching back the reference and N and A values to the correct values corresponding to the desired frequency. The first latch enable initiates the serial data reference input and again the loop opens and remains open until 300 microseconds after the second latch enable. The CPU again samples the lock detector at 100 microsecond rate for a zero condition created by the large transients of phase as the reference is incremented back to its original value. When the lock detector is zero, the loop closes again. Since the loop filter voltage is very close to the desired final value lockup occurs within 1 additional millisecond even though the loop filter time constants are 10 times larger. The possibility of transients will be significantly reduced due to the close proximity to the final frequency and its corresponding tuning voltage. The total time to lock has been measured at 4 milliseconds. The loop filter values have been optimized to achieve lock at the higher reference switching so the longer time constant filter reduces the affect of reference sidebands that could be audible to the user. With the decrease in lockin times by alternating the reference and counter values by factors of 10 or greater, it is possible to have scanning speeds of above 100 channels per second. The high speeds make possible better detection of received signals due to the reduction in transients occurring during the receive signal present sampling and detection. Much better squelch action with lower sensitivity thresholds will also be possible.

Memory Sequencing

When a frequency is loaded into channel memory, an algorithm will first load the correct values of the N and A counters and reference into memory 35. The algorithm will calculate the new values associated with the closest frequency to the desired frequency utilizing the times 10 or greater factors. The next available memory locations will have the values of N divided by 10 or greater and A equal to 0 or as close as possible to the final value if N is larger then the maximum A value with the reference frequency value at 10 times or greater as determined by the algorithm. In the scanning sequence, the values associated with N divided by 10 or greater will be loaded first. After lock is achieved, the CPU 25 will address the correct location for the correspondingly correct frequency code and output it to the synthesizer 11.

Loading a Channel

When a frequency has been entered into the display register and the "Enter" key of keyboard 37 is pressed, a frequency to synthesizer code conversion algorithm will be used to initially load the correct frequency into a memory location. Immediately after verifying that the correct code is loaded into memory 35, a second PLL code conversion routine will be activated that will convert the reference portion of the code and increase it by any factor N (usually 10 or greater). The A counter 17 will be reset to 0 if it does have a value larger than the maximum value of N/(10 or more) and the N counter 15 reduced by a factor identical to the change in the reference code. This new value will be placed in memory and is located in a sequence such that during scanning of memory channels, its frequency synthesizer code will be selected first. The second code conversion routine could also calculate a reference frequency that is not an exact multiple of the change in the N counter but instead would achieve a value that more closely represents a value that would provide a lockin frequency very close to the final value. The fundamental Fvco=(PN+A)Fref algorithm could easily be solved for the correct Fref that would achieve the nearest lock value since the A counter value would be 0 if N is made smaller than the maximum A or any value up to A corresponding to the closest frequency to the final desired frequency.

Direct Digital Synthesis of the Reference Frequency

The reference frequency can also be instantaneously shifted by a factor of N (usually 10 or greater) and returned by controlling from a direct digital synthesis of the reference frequency as shown in FIG. 4. The direct digital synthesis of waveforms is a well known technique in which a clock 39, phase accumulator 41, latch 43, Eprom 45, latch 47, 8-bit digital to analog converter (DAC) and filters 51 are used to synthesize a waveform, particularly a sinusoid. Different phase angles of a sinusoidal waveform have associated data words stored in eprom 45. When a phase angle is addressed, the corresponding waveform map will output the appropriate phase of a sinusoid. When the input is clocked at a rate with addressing occurring in the correct sequence the resulting output will be a sinusoid at a frequency one half of the clock frequency. From a stable oscillator or clock, a tuning number controls the rate at which a phase accumulator advances the phase of the output signal. This output phase information is converted to amplitude information by the waveform map, typically a waveform stored as a table of numbers in a read only memory. These amplitude numbers are converted to the final analog signal in the digital to analog converter (DAC). The advantage of this system is that the reference frequency can be incremented in fractions of a cycle. Instead of using a synthesizer with an imbedded reference counter and control logic, the direct digital synthesis of the reference can be controlled independently under microprocessor control. The sequence would be similar to the imbedded reference; however, the control of the reference would come from a look up table associated with the channel memory information. Depending upon the frequency band which defines the reference frequency, when a channel frequency has been loaded into the display register, the display frequency to PLL synthesizer code conversion subroutine will load the proper N and A values into the memory location. It then converts the A value to 0, if N is not greater than maximum A, with the N value divided by 10 or greater to its closest integer value and loaded into its nearest memory address. In the scanning sequence, the N value divided by 10 or greater is addressed first and simultaneously the tuning number is incremented to produce a corresponding increase in the reference frequency. The out of lock detector is coupled to the microprocessor and as soon as lock is achieved, the correct N and A values are loaded into the latches of the PLL N and A counters. At a slightly later (1 millisecond the loop is opened and the filter switching occurs), a latch enable 21 is initiated to load the N and A values into the counter and simultaneously the reference tuning number is decremented back to its original value. The first lock occurs within 1 to 2 Milliseconds and the additional time of less than 1 Millisecond to achieve final lock. Because of the direct digital synthesis, a reference associated with a much closer lock to the desired frequency can be calculated from the displayed frequency on display 53 and supplied to the PLL code conversion subroutine. This new reference when associated with the A counter equal to 0, if N is not greater than the maximum A, could place the lock virtually on frequency so that when the system switches back there will be no transients associated with the return thus achieving a lock in a minimum amount of time. The instantaneous changing of the reference and its virtually infinite resolution through its tuning number digital control will provide the fastest possible means to achieve synthesizer lockin. The technique of opening the loop to eliminate the large phase transient as described earlier is also utilized. The loop filter also switches values based upon the lock detector going to zero and testing for that condition at a rate of 10 Khz. It is possible to have a 2 millisecond or shorter lockin time with this combination of direct digital synthesis of the reference and multiple incrementing and decrementing of the N counters in conjunction with the filter switching and loop opening circuits under software control. This combination is clearly shown in FIG. 4.

Searching Utilizing an Analog to Digital Converter

The search function is comprised of incrementing in discrete steps from a programmed lower limit to a higher limit that has been entered into the search registers. Since the data is latched in the PLL counters, a 1 bit change in counter results in virtually no affect in transients of the loop settling time and therefore search speeds up to 225 channels per second are possible under conventional means.

The searching means can be controlled by the microprocessor 25 to either search in increasing frequency increments or decreasing frequency increments.

Figure 5:
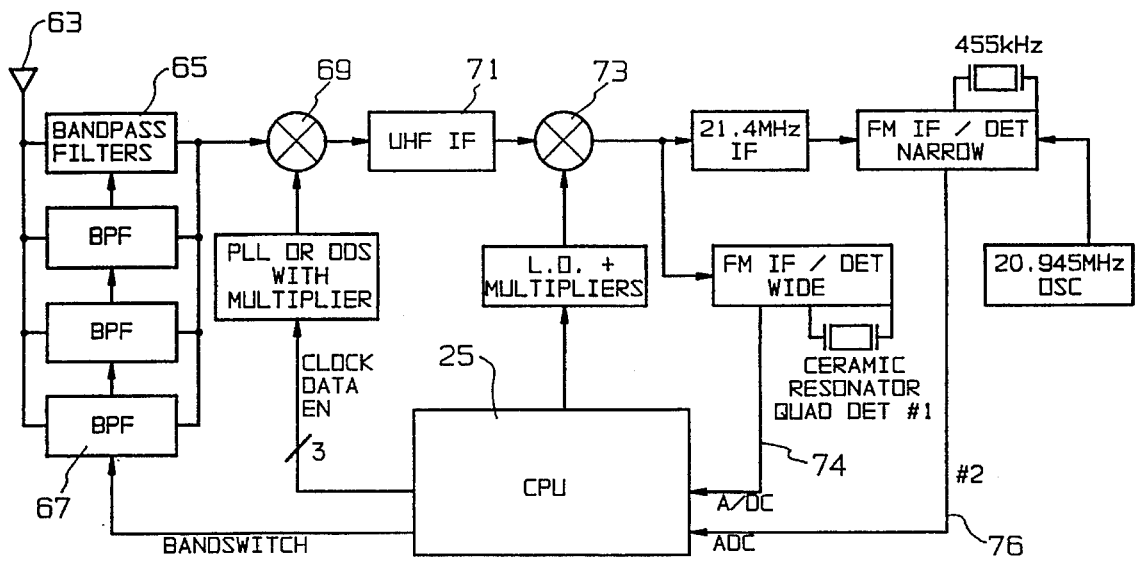
FIG. 5 is a schematic block diagram of a scanning receiver with spurious signal rejection.

The present state of the art utilizes an analog to digital converter (ADC), which is a part of the CPU 25, coupled to the output of one of two quadrature detectors by either line 74 or line 76 as shown in FIG. 5. The output of the detector has a DC value associated with the center frequency plus a delta frequency/voltage relationship. The ADC is set to read the delta voltage, and when a received frequency is within the range, the search system stops until the signal is removed or commanded by the operator to resume.

Figure 5A:
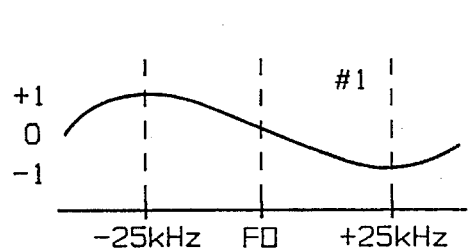
FIGS. 5a and 5b are quadrature detector response curves for wide and narrow band operation respectively.
Figure 5B:
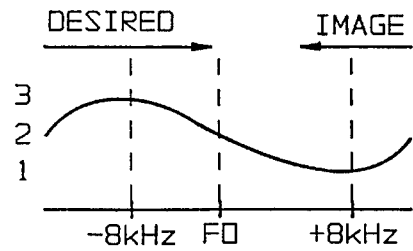

A new technique is disclosed that significantly improves upon the way the search center frequency is obtained. A quadrature detector has a very familiar S curve as shown in FIGS. 5a and 5b. An algorithm is generated based upon whether the search is increasing or decreasing. When no signal is present, noise would enter the ADC from the quadrature output. When a signal is received in the IF passband, if the algorithm senses a decrease or increase in the average level of the DC component from search increment to search increment, depending upon the search direction, then the algorithm can be set to test for the center frequency reference voltage. This will insure each lock-on is precisely on frequency where the old system would allow reception of signals that are anywhere within the frequency/voltage amplitude window which can vary due to component tolerances and temperature characteristics of the quadrature coil circuit.

Image and Spurious Responses, Birdie Rejection system

This search system and algorithm will also discriminate against some Birdies (troublesome internally generated signals) or all frequencies occurring from the image since they will or can enter the quadrature curve from the opposite direction. An image frequency is located on the opposite side of the local oscillator from the desired frequency and will travel through the quadrature detector in the opposite direction during search. Since it will travel through the quadrature detector in the opposite direction, the voltage/frequency relationship will be inverted and the ADC will show the voltage to be increasing when in actuality it should be decreasing based upon the direction of searching and therefore it will reject the image frequency as shown in FIGS. 5a and 5b. Many Birdies (But not all) occur in a similar manner and will be rejected. Most spurious responses occur from harmonics of the local oscillator and they will either be traveling in the opposite direction through the S curve or at a rate that is faster due to the multiplication of the harmonic. The method minimizes the likelihood of selecting an image or other spurious signal by varying the frequency of the local oscillator and selecting only those signals which are changing in frequency in a direction determined by the direction of change of frequency of the local oscillator. This scheme for rejecting spurious signals may be implemented as shown in FIG. 5.

FIG. 5 generally shows the RF and IF portions of a high speed scanning radio receiver having an antenna 63, RF amplifiers and bandpass filters such as 65 and 67, a mixer 69, a first intermediate frequency amplifying stage 71, and a second mixer 73. The term "mixer" is intended to include IQ and similar demodulaton systems as well as other schemes which accomplish a similar conversion.

As dictated by overall system architecture, the local oscillator frequency can be either above or below the receive frequency. The software algorithm would determine the band that is being searched for local oscillator location and from a look up table automatically set the sense of the ADC output to either look for a decreasing or increasing received signal voltage since the S curve of the quadrature detector switches polarity from high side to low side local oscillator injection. This would insure that the search for image and birdie rejection would perform as desired. An alternative approach would suggest that the second local oscillator could be switched over to the other side of the IF to invert the quadrature detector curve for each band.

The key to this search system algorithm is the fact that the ADC output to the microprocessor must provide a trend analysis after one or two frequency increments so that the algorithm will test and note the level of the first increment and on the second increment make a test and comparison to determine the trend (increasing or decreasing) voltage and then decide whether to accept or reject the signal.

Image Rejection While Scanning

Image rejection is possible while scanning through the use of the (ADC) analog to digital converter. The quadrature or discriminator curve can be used to determine whether the desired or image frequency is being scanned. The curve of a standard quadrature or discriminator has the familiar S curve shape, when a channel is received above or below Fo (Desired Channel frequency) the voltage will either be increasing or decreasing proportionally to a change in frequency. Due to the fundamental relationship between the local oscillator, in a superheterodyne receiver, and the desired and image frequency, they will have opposite directions of travel on the S curve as shown previously. In the scanning memory, a channel one increment removed from the desired frequency could be stored in a memory location that is next to the correct frequency. The scan sequence would output the lower channel, which is in the passband of the receiver, and then record the appropriate quadrature/discriminator voltage and then output the desired frequency. Depending upon the trend analysis of increasing or decreasing voltage the signal would either be accepted or rejected as an image.

Image and Spurious Rejection in Manual Operation

In manual operation in which the receiver is setting on a desired channel waiting to receive a signal, the microprocessor would be selecting the previous increment and desired frequency in an alternating fashion. The same sequence of events that occurred during scanning would occur with trend analysis and testing for increasing or decreasing voltages. Based upon the algorithm the system would either accept or reject the signal as an image or spurious response.

Direct Digital Synthesis of Local Oscillators

Figure 6:
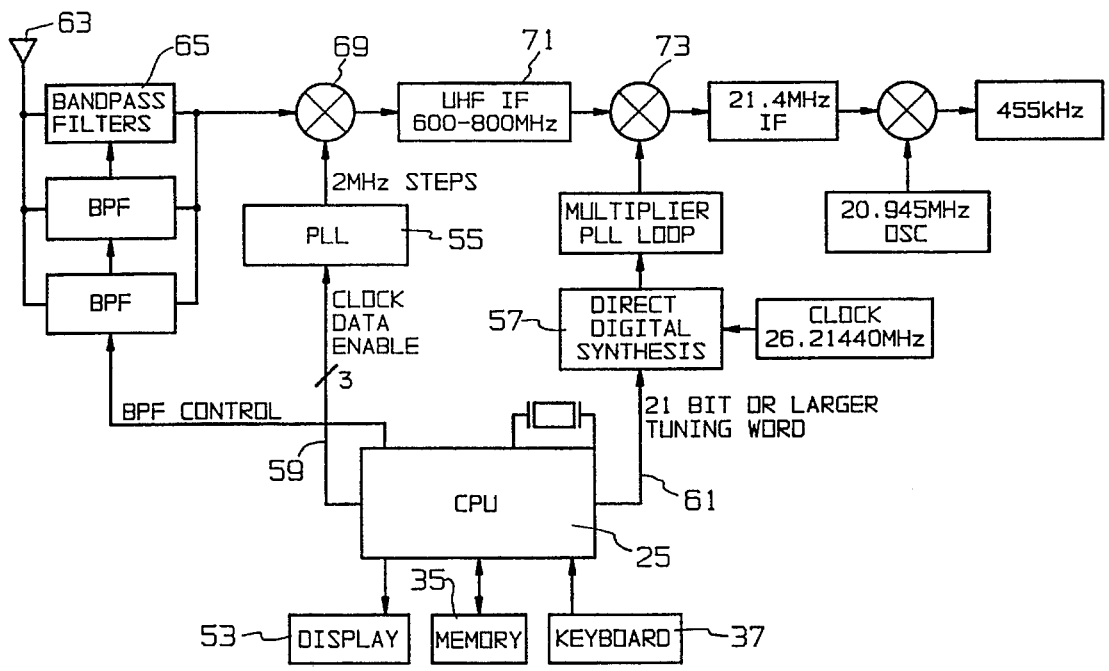
FIG. 6 is a schematic block diagram of a scanning receiver illustrating the dual synthesis feature of the present invention.

The direct digital synthesis technique can also be used to generate the frequency steps of the scanning and search sequence in the scanning receiver as shown generally in FIG. 6. The lock time for changing from channel to channel is the clock frequency divided by 2. The only requirement to change frequency is to change the binary tuning number into the phase accumulator. This value can be stored in any memory channel.

The direct digital synthesis can be applied in two different ways. One is to use a conventional PLL 55 operating as the first local oscillator with a high reference of 1 MHz or higher. This would allow for very fast lock times due to the high reference frequency. This system would also use a high vhf or uhf IF frequency. The second local oscillator would comprise the direct digital synthesis technique at 57 to essentially fine tune between the increments of the first local oscillator. The microprocessor 25 would output frequency data on line 59 to the first local oscillator and simultaneously output the tuning binary number on line 61 to the second local oscillator This sequence occurs very rapidly within 2 milliseconds. The RF and IF portions of such a dual synthesized superheterodyne receiver are shown in FIG. 5.

Figure 7:
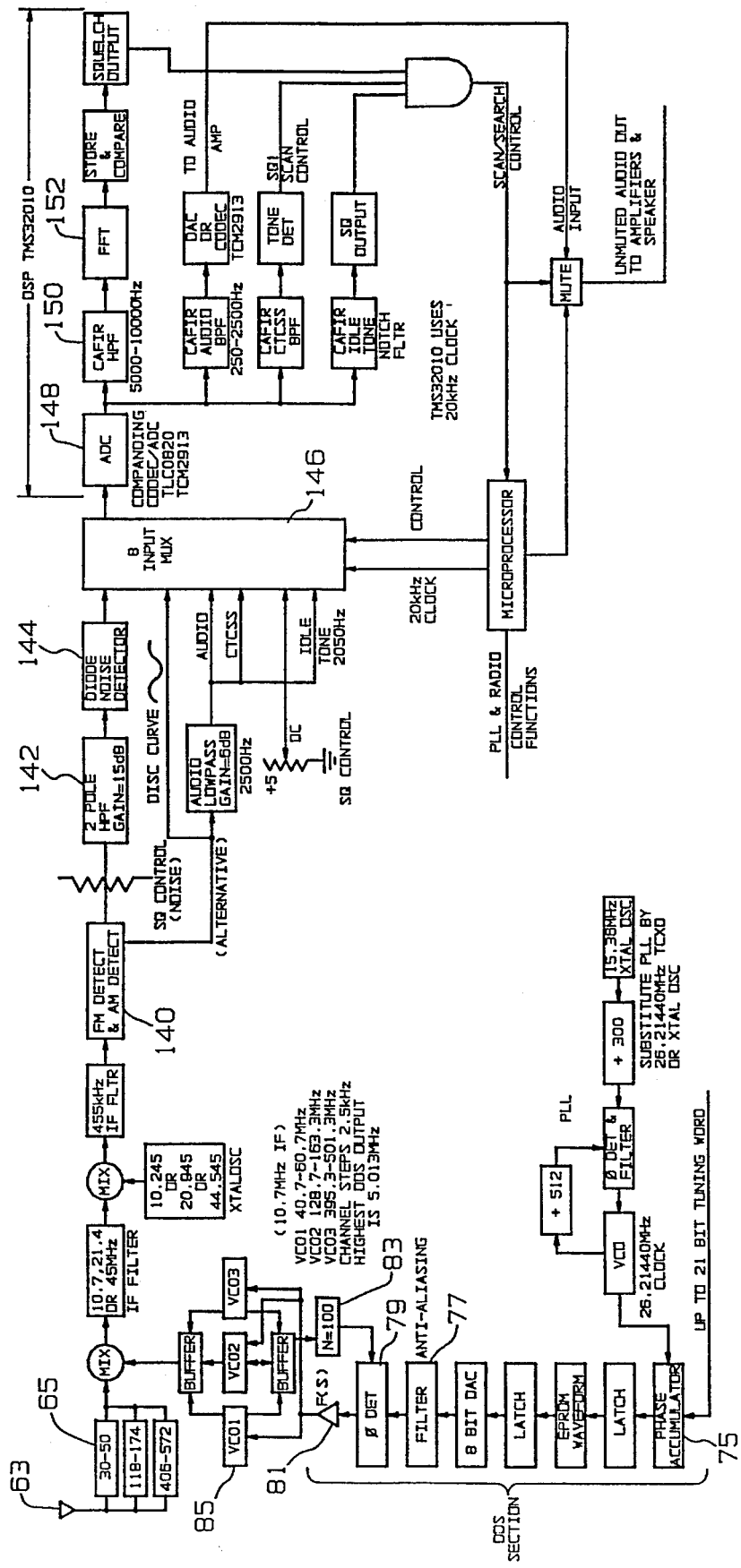
FIG. 7 is a schematic block diagram of a direct digital synthesis incorporated in a conventional scanning receiver with digital signal processing.
Figure 8:
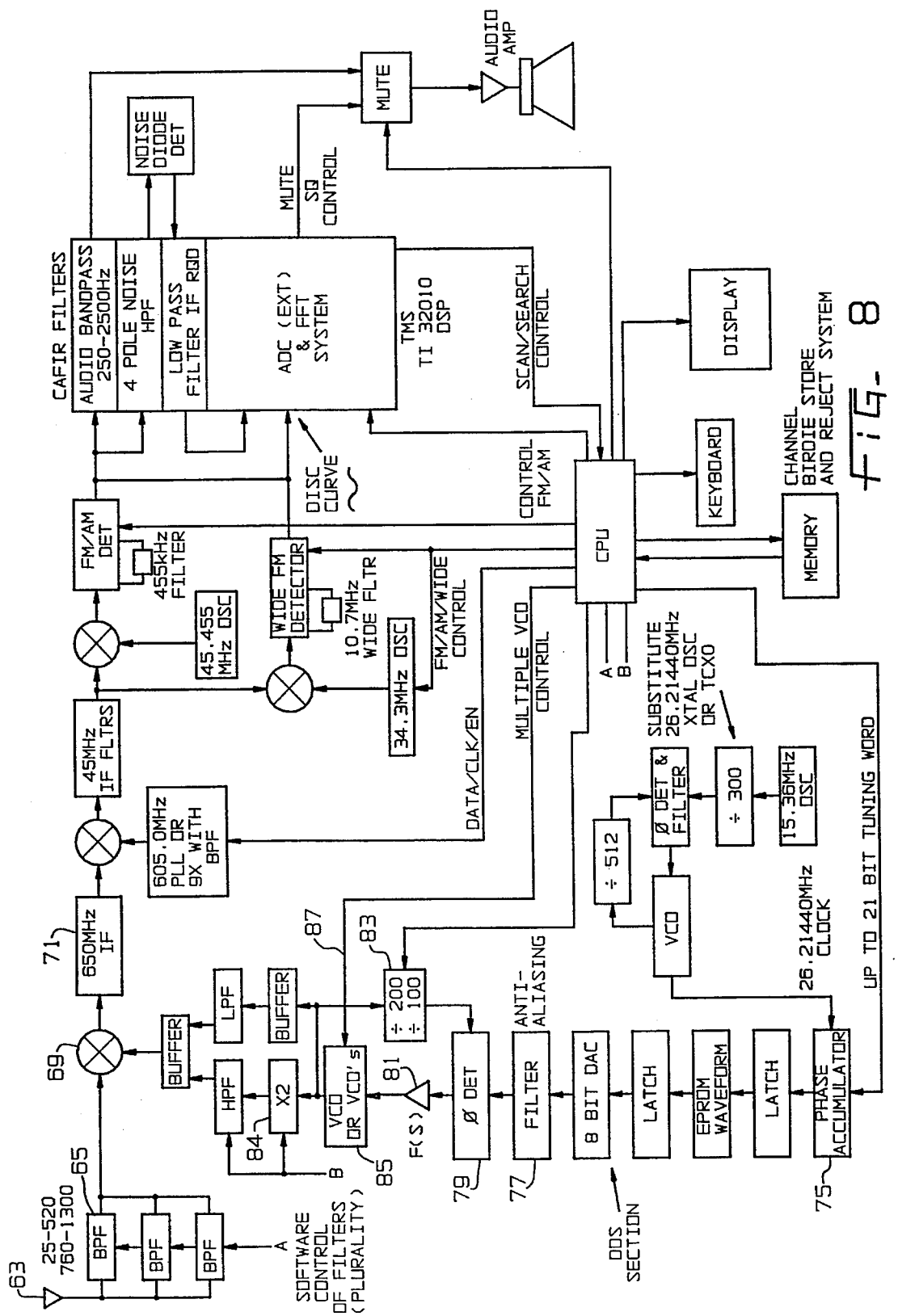
FIG. 8 is a schematic block diagram of a complete high speed scanning receiver with digital signal processing and direct digital synthesis.
Figure 9:
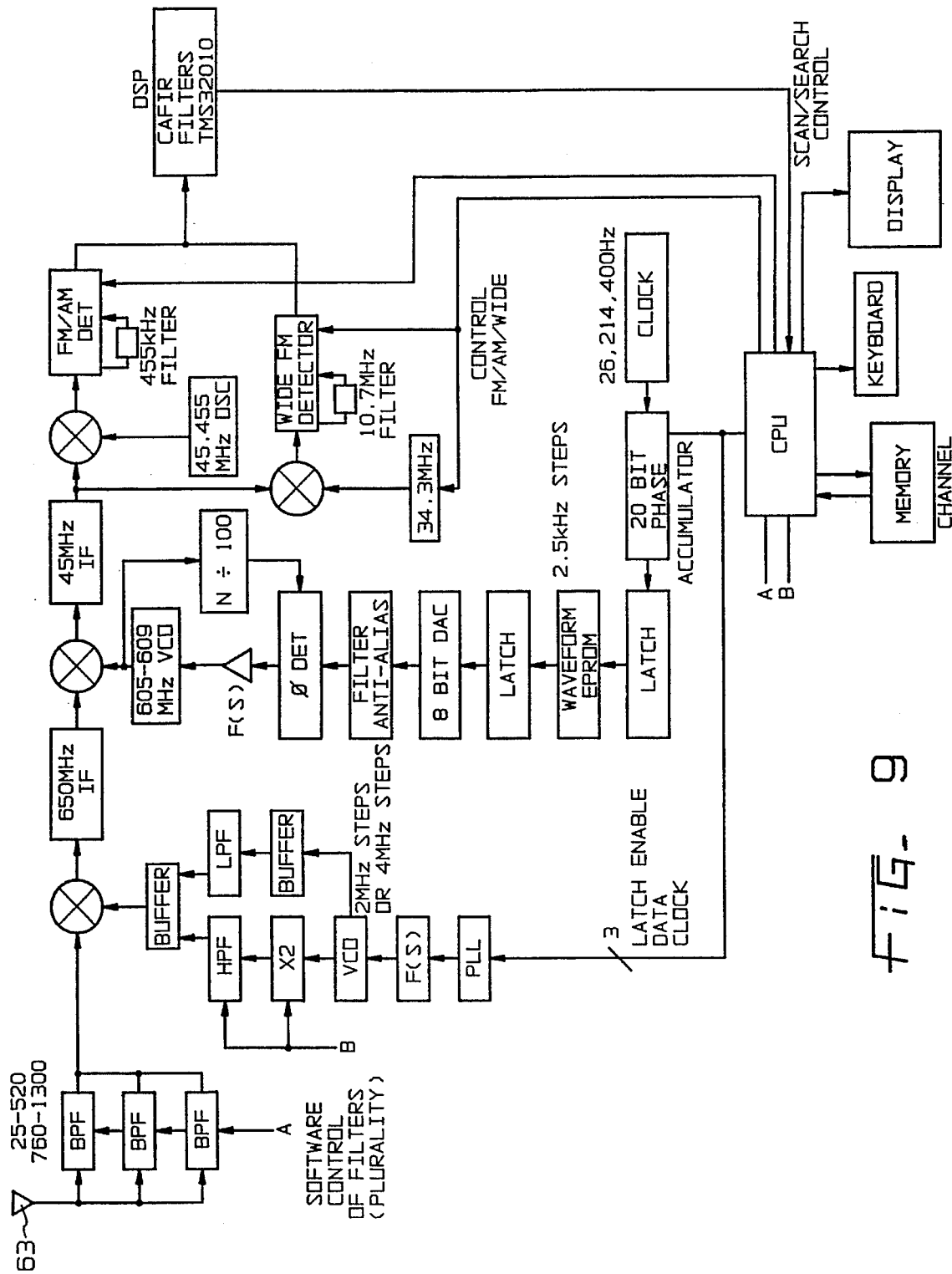
FIG. 9 is a schematic block diagram of another complete high speed scanning receiver with digital signal processing and direct digital synthesis for the second local oscillator.

The direct digital synthesis (DDS) technique can also be used to generate the frequency steps for the scanning receiver first local oscillator system. The lock time for changing from channel to channel is the reciprocal of the clock frequency divided by 2. The only requirement to change frequency is to change the binary tuning number in the phase accumulator 75. This value can be stored in any memory channel location. When tuning numbers are changed, the next frequency is phase continuous and no time delays are associated with the frequency changes. This technique will allow frequency changes in either scan or Search/Priority to occur in microseconds. This system of DDS of the first local oscillator is shown in FIGS. 7 and 8. The phase accumulator 75 is 21 bits wide and is clocked by a 26.21440 MHz clock signal. The frequency increments are determined by the clock frequency divided by the value of the accumulator or 21 bits which is 4,1943,304. This result is 12.5 Hz. The only system requirement is that the output of the DDS must be below 40% of the clock frequency to reduce aliasing frequencies. This system operates with an output of 9.75 MHz which is only 37.2% of the clock frequency and should produce very little alias signals. The output of the DDS 10 MHz anti-aliasing low pass filter 77 is coupled to a tri-state phase detector 79 and its output is coupled to a filter 81. The output of the filter 81 provides the tuning voltage for a UHF VCO (operating between 675 to 1170 MHz. in the embodiment of FIG. 8). The output of the VCO couples to a high speed counter with divide ratios of 100 and 200 in FIG. 8 and by 100 in the case of FIG. 7. The output of the counter is fed back to the other input of the tri-state phase detector 79. This forms the basis of the complete DDS system for a scanning receiver that covers 25 to 520 and 760 to 1300 MHz as shown in FIG. 8. While operating on the lower group of frequencies the counter value is 200 and when the higher frequency group is switched in, the counter is at 100 since the output is doubled at 84 to provide the local oscillator on the high side. Since the DDS increments in 12.5 Hz, times 200 provides a VCO step of 2.5 KHz and conversely when doubled with the counter 83 set at 100 the same increments occur. This system will provide any multiple of channel spacing in 2.5 KHz increments which covers all known FCC channel spacing within the tuning range. Obviously any number can be used as a reference and total increments of 50 Hz are possible when using other clock frequencies. In FIG. 7, several voltage controlled oscillators are used to cover the desired frequency range. As an alternative, FIG. 8 shows that a single voltage controlled oscillator 85 may provide the same function by a switching signal on line 87 which turns a transistor on to selectively shunt one of two series connected capacitors in the VCO circuit and lower the frequency. FIG. 9 shows a complete high speed scanning receiver with direct digital synthesis for the second local oscillator and incorporating the features of both FIG. 7 and FIG. 8.

Alternative DDS of Local Oscillator Using Mixing with PLL

Figure 10:
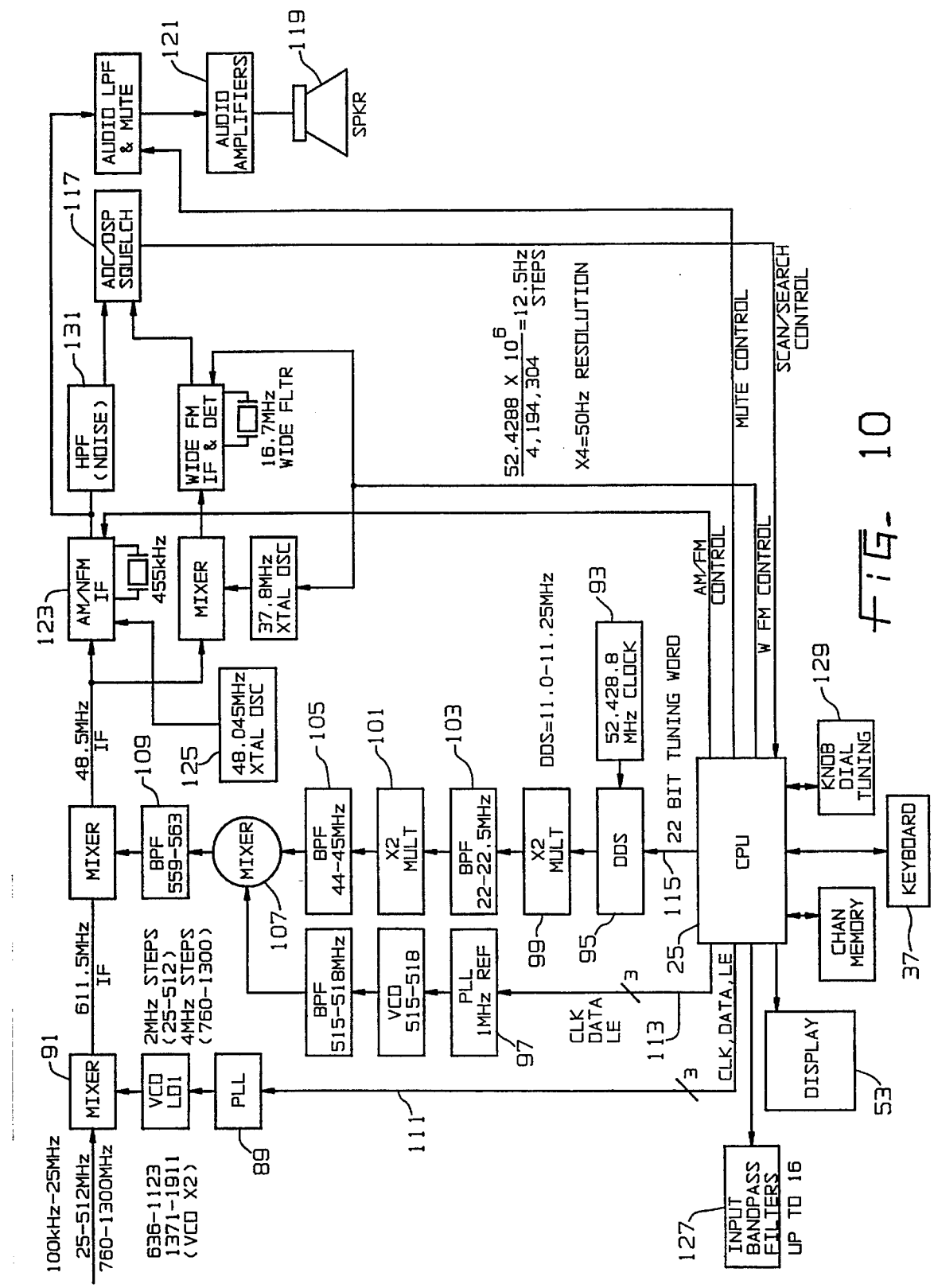
FIG. 10 is a schematic block diagram of yet a further complete high speed scanning receiver with digital signal processing and direct digital synthesis.

The details of the DDS system were described in the previous section. An alternative DDS tuning system is shown in FIG. 10. The receiver tunes ranges from 100 Khz to 512 Mhz and 760 to 1300 Mhz with a channel spacing of 50 Hz. The signal from the first local oscillator which includes PLL 89, is injected at mixer 91 on the high side of the 611.5 Mhz IF throughout the tuning range. The first local oscillator steps in 2 Mhz steps from 100 Khz to 512 Mhz and with a doubling circuit steps at a 4 Mhz step from 760 to 1300 Mhz. The 611.5 Mhz IF has a bandwidth in excess of 4 Mhz. The second local oscillator is comprised of a PLL 97 operating in 1 Mhz steps and a DDS system 95 operating with a step capability of 12.5 Hz. The clock 93 of the DDS operates at 52.4288 Mhz and in conjunction with a 22 bit (4,194,304) tuning word provides the 12.5 Hz steps. Two multipliers 99 and 101 and their associated bandpass filters 103 and 105 respectively provide additional rejection of the undesired multiplied signals. The DDS tunes a range of 11.0 to 11.25 Mhz in 12.5 Hz steps. The output of the DDS multiplier section 95–105 is fed into a double balanced mixer 107. A PLL 97 operating in the range of 515 to 518 Mhz is also employed. It has steps of 1 Mhz and uses a 1 Mhz reference frequency so that the total lock time is less than 1 millisecond. The output of the PLL 97 is coupled into the double balanced mixer 107. The output of the mixer is coupled through a multi-order bandpass filter 109 to reject all unwanted mixer products by 60 dB or more. The output of this system is 559 to 563 Mhz. Another application of this system is to keep the PLL at 515 Mhz and allow the DDS to tune from 41 to 45 Mhz. This would eliminate the lock time of 1 millisecond for the PLL but could create the potential for more birdies from the extended range of the DDS system. PLL 89 and PLL 97 and the DDS 95 are all controlled by the CPU 25 through timing signals, a serial data word and latch enable signals on cables 111, 113 and 115.

The total lock time is controlled previously by PLL 89 since it has a 250 Khz reference and a lock time of 3 milliseconds due to the additional time for bandswitching. The data word sequence is PLL 89 first then PLL 97 and finally DDS. This is because it takes the most time for PLL 89 to lock and the descending order of lock times dictates that the DDS is last. The DDS can be on frequency in 2 clock cycles or a few microseconds. The total time for a maximum frequency excursion of 100 Khz to 1300 Mhz is 4 milliseconds. During search, only the DDS would be involved except for PLL 97 every 1 Mhz and PLL 89 every 2 or 4 MHz. The DDS will allow search speeds of 200 channels per second with 5 milliseconds for the ADC or DSP (digital signal processing) squelch function 117 to detect a level change in the noise and generate a stop scan/search and unmute the receiver for reception and audio output from speaker 119 via audio amplifier 121.

The second IF stage 123 operates at 48.5 Mhz and is converted to 455 Khz by a signal from 48.045 Mhz crystal oscillator 125. This is used for AM or NFM reception. For wideband FM (Normal FM broadcast or TV audio) the 48.5 Mhz IF is converted to 10.7 Mhz with a 37.8 Mhz crystal oscillator. A wideband FM detector IF is used to recover the audio for reception.

The CPU 25 controls a plurality of bandpass filters 127 on the input and provides inputs for a tuning knob 129 that will increment the DDS in 50 Hz or larger steps depending upon user selection from the keyboard. The ADC and DSP squelch functions 117 will described in the following sections in conjunction with FIGS. 11 and 12.

Improved ADC Squelch System

Figure 11:
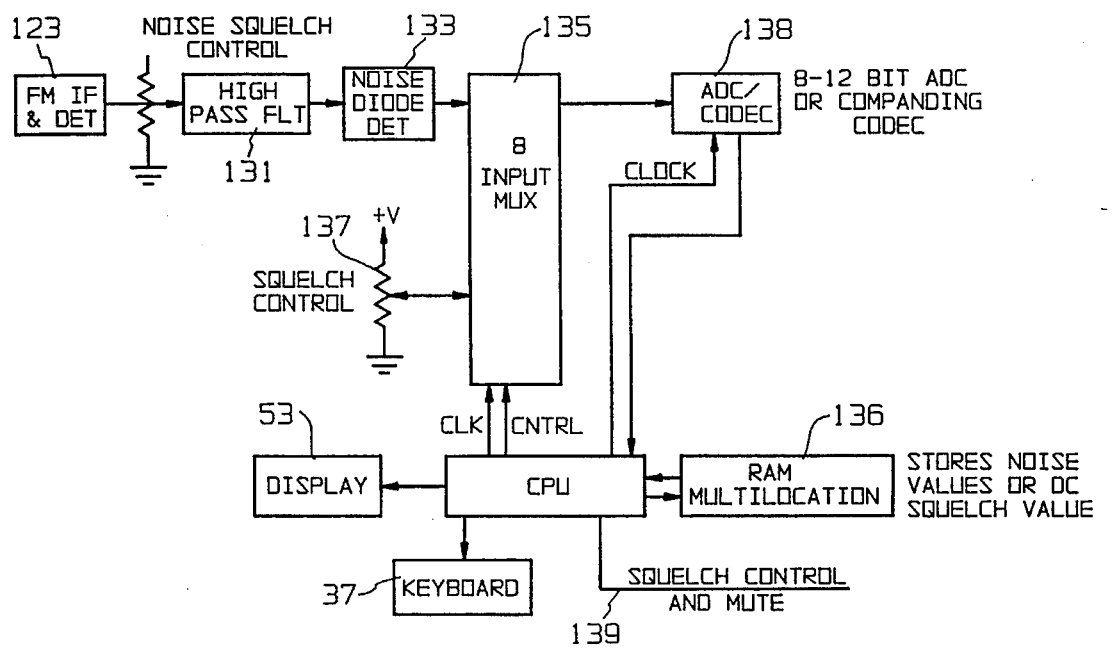
FIG. 11 is a schematic block diagram of an improved analog to digital converter squelch system.

The improved ADC squelch system utilizes a 4 pole highpass filter after the quadrature detector with a cutoff of 8 KHz and a gain of at least 15 dB. The output of the highpass filter 131 is connected to a voltage doubling noise detector 133. The output of the noise detector couples to an 8 input multiplexer 135. The multiplexer runs at a rate greater than 10 Khz. The multiplexer also has a D.C. input from the squelch control 137 and a disabling means to shut off the D.C. Voltage if desired. As an alternative, a squelch control on the noise input level to the ADC will also provide the reference signal for comparison purposes to determine signal presence. The output of the multiplexer 135 connects to a 8 to 12 Bit analog to digital converter or A-Law or Mu-Law companding codec 138. The output of the 8–12 Bit converter or Codec couples to (RAM) Random Access Memory 136 that is available in the microprocessor or to external dedicated RAM. The 8–12 Bit ADC takes a minimum of 32 samples of the noise and then divides that value by a minimum of 32 to obtain an average value. The value is stored in either internal or external RAM. During the multiplexing, the D.C. value or its equivalent noise value of the squelch control has also been stored in another RAM location and under microprocessor control the values are compared and if the test of the noise value average is below the digitized D.C. voltage level, the command to open the squelch and stop the scan/search/priority function is outputted on line 139 since a signal present always reduces the noise content. An automatic squelch function can be generated by utilizing the ADC to obtain an average and store that value in RAM. Immediately a second succeeding average value is obtained and stored in RAM. Then the two values are compared and if the value is different by a predetermined amount established in software, then the squelch output is enabled stopping the scan/search/priority functions as shown in FIG. 11. Similarly the previous RAM storage technique of succeeding noise values which are stored in RAM similar to a shift register may be utilized. The first value is shifted in location 2 when the second value is obtained. When the third value is obtained, the first value falls off the end similar to a shift register. The multiplexed digital value of the D.C. squelch control value will be stored in a third register and under software control this value will be used to set the limit that the succeeding noise values will be compared to each other. As the D.C. squelch control digitized value increases, the larger the difference between succeeding noise values required in order to open the squelch and stop the scan/search/priority function. Once a signal present has reduced the noise value the testing will indicate the change. During signal present, there will not be any change and therefore no change in squelch status. At loss of signal and increase in noise, the comparator will detect the change in the noise and output the scan and mute signals. The RAM noise value testing is primarily looking for transitions in the value of the noise level average.

Alternative ADC Squelch Function

An alternative method of detecting signal present is by monitoring when the serial data is outputted to the PLL at each channel increment immediately following the bandswitching and modulation mode data and simultaneously to the reference and N and A values are outputted by the CPU. A sample of the noise is taken and its total value is digitized in the ADC and placed in RAM as a reference for that channel frequency. The reference is used to compare its value to at least 3 signal present samples occurring after PLL lock is stabilized. The two digitized values are magnitude compared and if the value is different by a predetermined amount established in software which can have different comparison limits based upon mode (modulation) then the squelch output is enabled stopping the scan/search/priority functions. At the beginning of a new channel, the process is repeated by generating a new reference of the noise power (digitized) for each channel. This is particularly important since the squelch control setting which adjusts the level of the noise would need a new reference for each channel as it is changed. During a signal present condition, the reference will be replaced by the signal present value and digital magnitude compared at 10 millisecond intervals against the signal present value. When signal level is reduced causing an increase in noise up until it has exceeded the maximum difference value, then the ADC detects it as a loss of signal and outputs the mute and resume scan/search signals. A mute signal is generated at a loss of more than 50 milliseconds of signal. Hysteresis of at least 50 mv is provided by a software window that is preset at 25 mv above and 25 mv below the noise energy value. This value is permanently set into the squelch check sub routine and is primarily intended for the reduction of squelch chatter near the squelch threshold. During scan in a conventional non DDS scanner, when one channel is preceded by another with a reference change, a large transient occurs which will delay the lock time and consequently the squelch function. At this time, a 5 millisecond delay is added for the squelch function and PLL code output momentarily slows the scan process. This allows time for the loop to lock. This only occurs at reference changes from channel to channel. In search operation with a constant reference, this delay function is not required.

Digital Signal Processing (DSP) of the Squelch Function

The current state of the art in squelch detection circuits utilizes 4 poles of high-pass filter using operational amplifiers, a noise detector diode and input to an ADC that takes a minimum of 32 samples of the noise and sums that level and then divides that level by a minimum of 32 to obtain an average value for the noise. When a signal quiets the receiver, the noise value decreases and a test of the average value indicates the converted level is below a prescribed software limit and the squelch opens. This system is prone to missing signals and chattering at the threshold of the squelch value.

The proposed invention eliminates some of the problems associated with the current state of the art. One primary purpose of Digital Signal Processing (DSP) is to utilize the Cascadable Adaptive Finite Impulse Response (CAFIR) digital filters that can be controlled by merely changing the filter coefficients in the filter algorithms. Most external filter functions can be implemented in software without the phase errors. Some external components to produce equivalent analog filters for preshaping the response prior to detection are suggested but can also be implemented by the CAFIR filters. Such filters can be changed under software control to implement bandwidth, frequency, order, type of filter (Butterworth, elliptic, etc.), lowpass, highpass, bandpass and notch. These functions can be seen in FIGS. 7 and 12.

In FIG. 7, the output of the receiver quadrature detector 140 is connected to a multi-order analog highpass filter 142 with a corner frequency of 8 Khz and of gain of least 15 dB. The output of the filter is connected to a diode noise detector 144. Immediately following the diode detector is an 8 input multiplexer 146. The output of the multiplexer couples to an analog to digital converter (ADC) 148 such as the TLC0820 or any companding A-law or Mu-law Codec. The output of the ADC or codec 148 is coupled into a high pass filter 150 such as the Texas Instrument TMS32010 CAFIR filter which is a multi-order highpass with a cutoff of 8 Khz. This total filter system removes the voice components from the noise signal. The response of the filter can be changed under software control to achieve the optimum slope for the reduction of voice components. This order value is between 4 and 6 depending upon the desired rejection of voice components. The output of the filter is coupled to a Radix 2 loop or Radix 4 Fast Fourier Transform (FFT) portion 152 of the TMS32010. The FFT is performed as a 64 point FFT in 2.87 miliseconds with a Radix 2 loop and 0.6 miliseconds in a Radix 4 FFT. Each successive FFT value is stored as a 16 bit word representing the energy level of the noise. At intervals of 5 miliseconds or less, a new FFT is performed and digitally compared against the previous energy level or FFT of the noise and when there is a difference predetermined in software which represents a signal present, the output of the digital comparator will provide a squelch output signal to stop the scan/search/priority function and unmute the receiver. The squelch control can provide a DC value or a variable noise level coupled from the control though the ADC or Companding Codec and entered as a difference level for the digital comparator to determine squelch action under software control.

Figure 13:
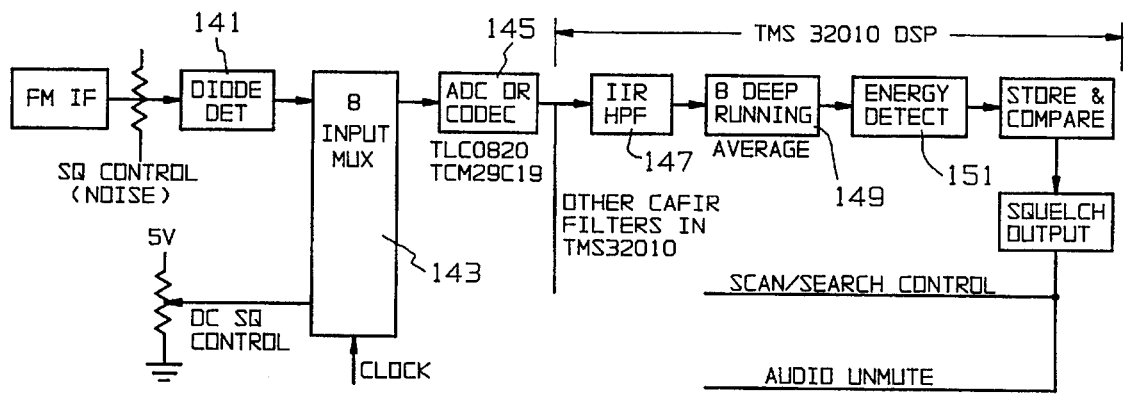
FIG. 13 is a schematic block diagram of digital signal processing for squelch using an infinite input response digital filter system.

In FIG. 13, the intermediate frequency is connected to a diode noise detector 141. Immediately following the diode detector is an 8 input multiplexer 143. The output of the multiplexer couples to an analog to digital converter (ADC) 145. FIG. 13 illustrates a similar but alternative function is to use the companding Codec Texas Instruments TCM29C19 or equivalent after the noise detector and multiplexer and connect the Infinite Impulse Response (IIR) digital filter that can be implemented under software control to determine the coefficients for a multi-order highpass filter with a cutoff of 8 Khz. The IIR filter is located in the Texas Instruments TMS32010 digital signal processor as shown in FIG. 13. The output of the IIR filter 147 is connected through software to an 8 Deep Running Average Energy Detector 149 which is a device which maintains an average for the eight most recent values. The threshold is controlled through software and by storing the 16 bit word representing the output of the energy detector 151 and digitally comparing against the next 8 Deep Running Average 16 bit word in 5 milliseconds or less, a signal present can be detected by specifying the threshold or digital difference between the 8 Deep Running Averages. When a signal is present, the noise level or energy level will be lower and will be detected in the digital comparison which is controlled by the squelch control coupled through the Companding Codec or conventional ADC. The DC squelch control voltage will enter through software the digital value for the difference between the 8 deep running averages and therefore set the threshold for squelch action. The output of the energy detect will provide a logic level to stop the scan/search/priority functions and unmute the receiver. The 8 deep running average occurs at a rate much faster than the FFT and would provide a finer resolution in detecting a difference in noise level which corresponds to a signal present.

The input to the Companding Codec or conventional ADC 145 is multiplexed at a rate of 20 Khz or higher to prevent any MUX noise showing up in the outputs of the various filters.

In the various applications of the CAFIR digital filters, an additional Companding Codec or ADC is required after the DSP CAFIR digital filters to convert the digital filter information back to analog for further processing such as to an audio amplifier.

Squelch hysteresis is obtained by software control in an adaptive mode by adaptively changing the energy level difference (FFT or 8 Deep Running Average) once a signal present exists and the squelch output control has become active. The adaptive control of the noise energy or FFT will produce a larger digital difference which will mean the signal present must change by a larger amount before the squelch circuit closes and therefore creates the desired hysteresis.

Figure 12:
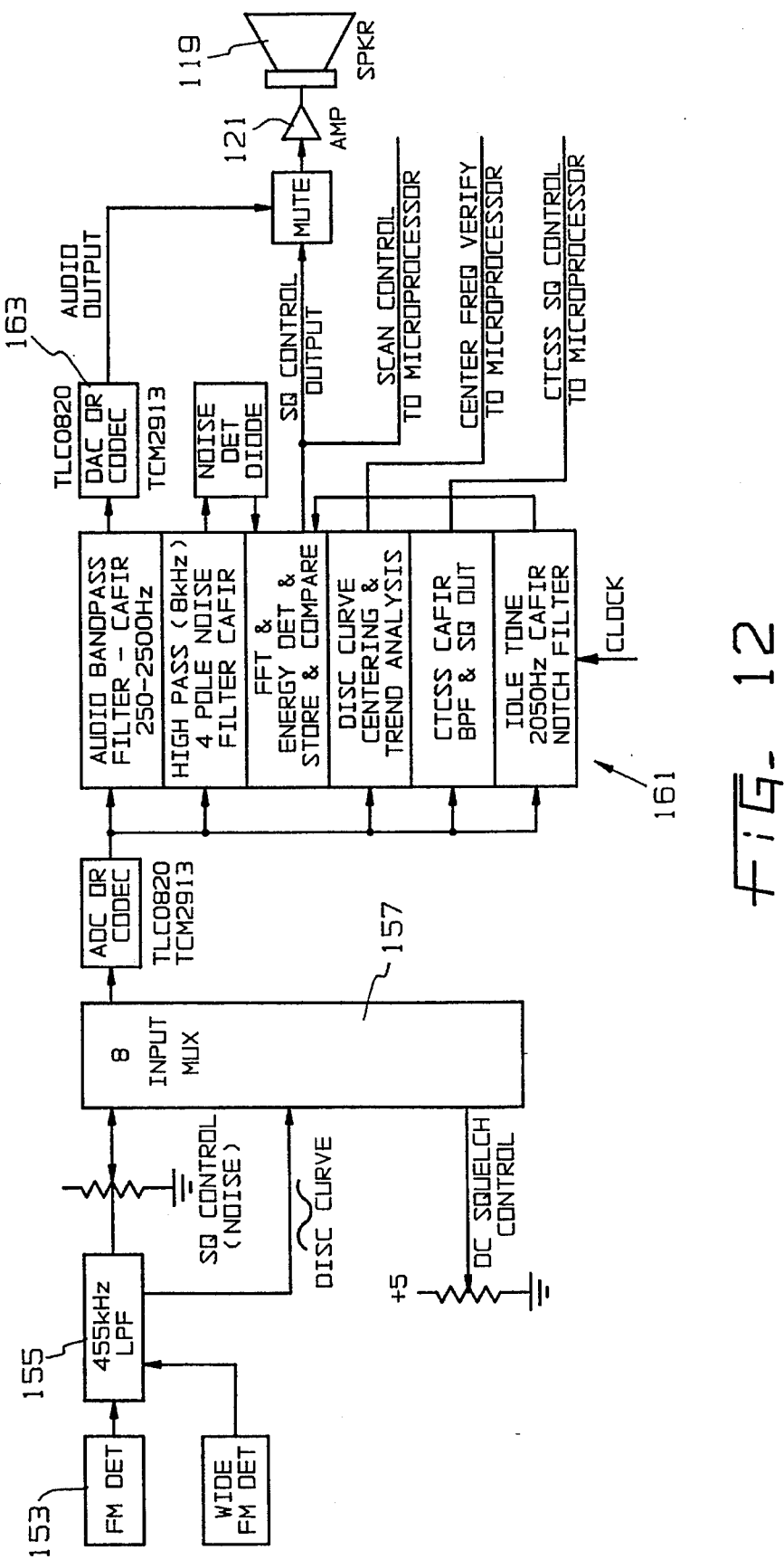
FIG. 12 is a schematic block diagram of an improved digital signal processing squelch system.

Returning to FIG. 12, a second output from the quadrature detector 153 (one input was supplied to FIG. 13) is to an analog lowpass filter with a gain of 6 dB. The output is multiplexed at 157, fed to the Companding Codec or conventional ADC 159 and then into the CAFIR filter (multi-order bandpass with corners at 250 and 2500 Hz) to filter the noise from audio components and produce a good signal/noise ratio of recovered audio as shown in FIG. 12. The digital filter audio values are reconstructed by a Companding Codec or conventional ADC 163 which is finally sent to the speaker 119 for listening. The coefficients of the filter can be altered to provide an 8 pole filter response for the band-pass filter to insure that distortion products are not present in the received signal.

The third CAFIR filter can have coefficients to operate as a notch filter to eliminate the (idle tone) present on most VHF/UHF mobile telephone signals. The object is to reject the idle tone such that the receiver will continue scanning in these telephone bands. The telephone idle-tone operates at 2050 hz and is easily implemented in the CAFIR filter operating as a notch with the correct coefficients selected in software as shown in FIG. 12. The filter can also be adaptive to follow interfering tones and automatically reject them.

Tone operated squelch using the CTCSS (continuous tone controlled squelch system) tones can be selectively filtered by using a CAFIR bandpass filter with the corresponding coefficients to provide a multi-order, 8 pole or greater response. Adaptive filtering would allow following all 37 different CTCSS tones and detecting the desired one.

An additional function of the CAFIR filter would be to provide a multi-order notch at the reference frequency of the PLL to eliminate any reference sidebands. The adaptive approach can be used by changing filter coefficients to adapt or follow the appropriate reference and corresponding band to insure notch filtering of the reference as bands and reference frequencies are changed.

Voice Recognition DSP Circuits

Voice recognition circuitry fully capable of recognizing a preprogrammed voice characteristic can be utilized in the same CAFIR filter. The Texas Instruments TMS32010 DSP FFT and ADC system is fully capable of providing most of the requirements associated with scanning receivers. This capability plus the FFT voice recognition could allow a scanner user to preprogram his scanner to only accept his spouses voice on a telephone channel as an example or his voice to control a relay output or plurality of relay outputs for controlling lights, TV, VCR etc.

DSP as Pilot Tone Detect for ACSB or Cellular SAT

The Texas Instruments TMS32010 DSP CAFIR filter can be programmed to provide a multi-order bandpass filter to detect the 3000 Hz pilot tone for an ACSB amplitude companded single sideband signal or for the 5970, 6000, 6030 Hz(SAT) supervisory audio tone for cellular telephone communications. In both cases, another CAFIR filter can be programmed to notch out the tones so that they are not audible to the user.

Switched Capacitor Filters for Squelch Function

The present state of the art utilizes analog highpass filters and passive RC lowpass filters for the squelch function filters. The disadvantage of these have been described previously.

Figure 14:
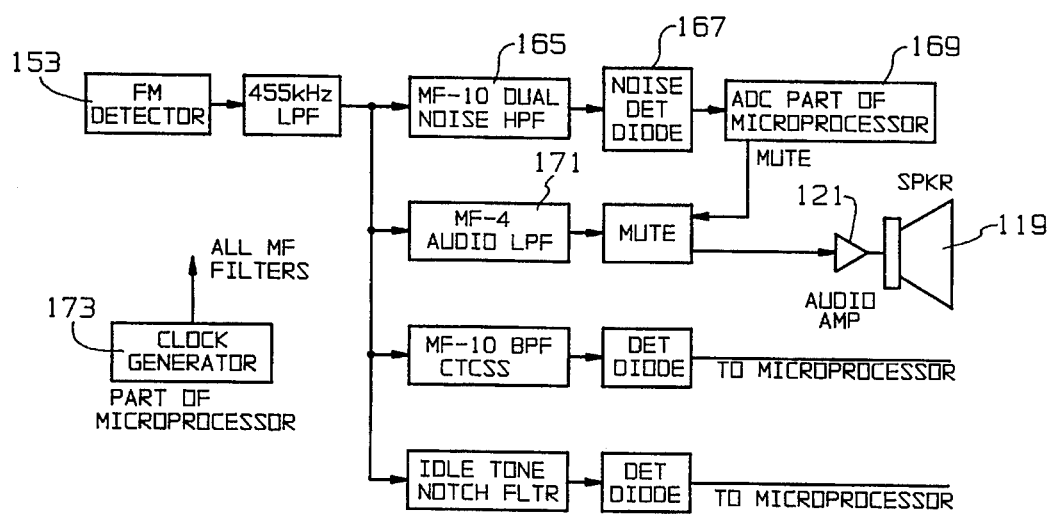
FIG. 14 is a schematic block diagram illustrating audio filtering and squelch control with switched capacitor filters.

The noise highpass filter is designed using a second order switched capacitor filter as shown in FIG. 14. A National Semiconductor MF-10 dual 2nd order highpass filter configuration 165 can be inserted in place of the operational analog highpass filter immediately following the quadrature detector 153 and its associated 455 Khz low pass filter. This filter, as previously described, would eliminate voice components and have a minimum corner frequency of 8000 Hz. An identical filter comprised of the second half of the MF-10 is connected after the first noise highpass filter to increase the filter response to a 4th order highpass. The output of the filter is connected to a diode noise detector 167. After detection, the noise signal is connected to an ADC input 169 on the microprocessor or external Texas Instruments TLC0820 ADC. The ADC will perform the function that has been previously described by sampling and averaging the noise content and then comparing a change to determine when a signal is present to activate the squelch function. The received audio is coupled to a National Semiconductor MF-4 lowpass switched capacitor filter 171. The response is set to 2500 Hz for the corner frequency (Fc). This filter will be a 4th order lowpass to reduce noise and distortion products to yield a good signal/noise ratio. The output of this filter is coupled to amplifiers that connect to a speaker 119.

Since the MF-4 and all other switched capacitor filters are controlled by clock frequencies (shown in FIG. 14 as 173 and part of the microprocessor) either internal or external with ratios of 50 or 100:1, the frequency response is determined by the clock frequency within =0.3%. The response of the filter is instantaneous to sudden changes in clock frequency.

Sharp bandpass characteristics of the MF-10 can be used to filter out CTCSS tones for control of the scanner. The notch filter characteristic can also be used to notch out the 2050 idle tone on mobile telephone.

The switched capacitor filter, while not as adaptable as the Texas Instruments TMS32010 DSP CAFIR filters, can perform adequately when used in the squelch and audio filtering system of a scanner receiver.

Birdie Lockout by Memory Storage and Lockout Processing

A separate memory controlled by the microprocessor would be provided for one purpose. Since a complex scanning receiver will have birdies (Self Generated Signals) especially covering the wide frequency range of the proposed scanning receiver, the memory is provided to search from 25 to 1300 Mhz and store all frequencies that stop the search function. This can be accomplished at the factory or by the end user. With the antenna removed and preferably in screen room the search will store all frequencies in this special memory. The main purpose of these frequencies is to have the microprocessor check for these as a normal search is being conducted by the user and when a frequency that is in memory is ready to be outputted to the DDS or PLL, falls on the "list" then it is rejected and never outputted to the DDS or PLL. This simple means will allow for rapid and continuous searching without stopping on undesired and unusable frequencies. This memory is shown in FIG. 8.

From the foregoing, it is now apparent that a novel ultra high speed scanning radio arrangement has been disclosed meeting the objects and advantageous features set out hereinbefore as well as others, and that numerous modifications as to the precise shapes, configurations and details may be made by those having ordinary skill in the art without departing from the spirit of the invention or the scope thereof as set out by the claims which follow.

What is claimed is:

1. The method of operating a phase locked loop frequency synthesizer to sequentially generate a plurality of different frequency signals including the steps, for each such frequency, of:

coarse tuning the closed loop to achieve phase coincidence at a first frequency near the desired final frequency;

fine tuning the closed loop to adjust the frequency from the first frequency to the desired final frequency;

opening the loop for a short time interval between the steps of coarse tuning and fine tuning to prevent undesirable disturbances in the operation of the loop; and reclosing the loop to complete the fine tuning at a time when the loop is near phase coincidence.

2. The method of operating a scanning signal receiving radio of the type having a variable frequency local oscillator and a mixer for combining a received signal with a signal from the local oscillator to generate an intermediate frequency signal to minimize the likelihood of selecting an image or other spurious signal comprising the steps of varying the frequency of the local oscillator in a predetermined direction and at a predetermined rate of change, and selecting only those received signals corresponding to an intermediate frequency signal which is changing in frequency in a direction determined by the direction in which the local oscillator frequency is varied and which intermediate frequency signal is changing infrequency at a specified rate determined by the rate of change of frequency of the local oscillator.

\* \* \* \* \*